US008643410B1

(12) United States Patent
Bhargava et al.

(10) Patent No.: US 8,643,410 B1
(45) Date of Patent: Feb. 4, 2014

(54) SYSTEM FOR COMPENSATING FOR VARIATIONS IN CLOCK SIGNAL FREQUENCY

(75) Inventors: Prashant Bhargava, Gurgaon (IN); Mohit Arora, Faridabad (IN); James R. Feddeler, Austin, TX (US); Martin Mienkina, Bystrice (CZ)

(73) Assignee: Freescale Semiconductor, Inc., Austin, TX (US)

( * ) Notice: Subject to any disclaimer, the term of this patent is extended or adjusted under 35 U.S.C. 154(b) by 31 days.

(21) Appl. No.: 13/602,199

(22) Filed: Sep. 2, 2012

(51) Int. Cl.
*H03K 9/08* (2006.01)
(52) U.S. Cl.
USPC ............ 327/141; 327/145; 327/160; 327/39; 327/47; 327/48
(58) Field of Classification Search
None
See application file for complete search history.

(56) References Cited

U.S. PATENT DOCUMENTS

| | | | | |
|---|---|---|---|---|
| 5,796,272 | A * | 8/1998 | Yazaki | 327/41 |
| 5,838,171 | A | 11/1998 | Davis | |
| 6,086,244 | A | 7/2000 | Yin | |
| 6,333,646 | B1 * | 12/2001 | Tsuzuki | 327/47 |
| 6,791,428 | B2 | 9/2004 | Senthilkumar | |
| 8,447,004 | B2 * | 5/2013 | Tomar et al. | 375/354 |
| 8,471,619 | B2 * | 6/2013 | Ge | 327/291 |
| 2009/0085684 | A1 | 4/2009 | Guo | |
| 2009/0160569 | A1 * | 6/2009 | Gros | 331/176 |
| 2012/0110364 | A1 | 5/2012 | Bhargava | |

FOREIGN PATENT DOCUMENTS

| | | |
|---|---|---|
| EP | 1304603 A3 | 8/2006 |
| WO | 2009156795 | 6/2008 |

OTHER PUBLICATIONS

Steve Underwood, Implementing a Temperature Compensated RTC (URL: http://focus.ti.com/lit/ml/slap107/slap107.pdf), MSP430 Advanced Technical Conference, 2006.
Maxim_IC, Real Time Clock Compensation, Application Note 4972 (URL: http://www.maxim-ic.com/app-notes/index.mvp/id/4972), Feb. 4, 2011.
Intersil, Low Power RTC with Battery-Backed SRAM and Embedded Temp Compensation ±5ppm with Auto Daylight Saving, ISL12023 (URL: http://www.intersil.com/content/dam/Intersil/documents/fn66/fn6682.pdf), Dec. 6, 2011.

* cited by examiner

*Primary Examiner* — Tuan T Lam
(74) *Attorney, Agent, or Firm* — Charles Bergere

(57) ABSTRACT

A system for compensating for variations in the frequency of an input clock signal having a first frequency includes a coarse counter that receives the input clock signal, counts a predetermined number of clock pulses of the input clock signal, and generates a coarse compensated clock signal having a second frequency. A first compensation module adjusts a clock pulse of the input clock signal based on a coarse compensation value. A residual period adjustment module accumulates a fine compensation value for each clock pulse of the coarse compensated clock signal. A fine counter operates at a third frequency of a fine clock signal, receives an adjusted delay value based on the accumulated fine compensation value, counts a number of fine clock pulses in each clock pulse of the coarse compensated clock signal, and generates a fine compensated clock signal having the second frequency.

19 Claims, 3 Drawing Sheets

SYSTEM FOR COMPENSATING FOR VARIATIONS IN CLOCK SIGNAL FREQUENCY

BACKGROUND OF THE INVENTION

The present invention generally relates to electronic circuits, and, more particularly, to a system for compensating for variations in the frequency of clock signals used in electronic circuits.

Electronic circuits including microprocessors, microcontroller units (MCUs), digital signal processors (DSPs), application specific integrated circuits (ASICs), and systems-on-chips (SOCs) often perform functions such as storing or retrieving data that require synchronizing the data with clock signals. An external clock source, such as a crystal oscillator or a clock generator, generates and provides a clock signal having a predefined operating frequency to the electronic circuit. The accuracy of the clock signal determines the efficiency of the electronic circuit. However, due to certain external factors, such as excess voltage, aging, temperature rise, and overheating, delays are introduced in the clock signals that can cause the circuits to process data improperly, resulting in faulty outputs. For example, if the electronic circuit is used in time critical applications such as medical applications, any inaccuracy or delay in the clock signal may introduce delays in the treatment time, which may lead to serious consequences. Therefore, frequency variations, i.e., the delays in the clock signals, need to be compensated for or corrected.

Frequency variations or delays in a clock signal usually have two components, viz., a coarse (or integer) delay component and a fine (or fractional) delay component. In conventional delay compensation solutions, the fine delay is accumulated over a predetermined compensation interval to compensate for a single coarse delay over the predetermined time interval. For power critical applications, this delay adjustment is performed using a low frequency clock. However, a low frequency clock fails to provide an accurate edge placement on the output clock that is generated. Applications requiring a reference output clock signal for calibration take longer as the compensation interval is not always unit time (one second) and does not have accurate rise or fall edge placement. Therefore, to compensate for the fine part in a single 1 Hz period, a fast clock (i.e., a high frequency clock) is necessary. High frequency clocks increase power consumption and operating cost, which is not desirable for applications that run on batteries or those which are power-critical.

Conventional delay compensation solutions assume a variable-length one-second period in a predetermined time period counted by the real time clock (RTC). The length (or duration) of a variable-length second period is changed once for each predetermined time period. By changing a time-correction coefficient, the variable-length one-second period can insert at least one 32 kHz clock cycle in each predetermined time period interval. Delays in clock signals are also compensated in small intervals of time instead of for every one second interval. For example, a clock delay or a frequency offset may be accumulated and compensated every fifteen seconds using known methods of delay compensation. However, compensating every fifteen seconds may not be suitable for time-critical applications. although conventional techniques compensate for the delay at periodic intervals, they fail to compensate for the delay introduced in each unit of output clock cycle.

Many time-critical electronic circuits require an accurate 1 Hz clock signal that is generated using a 32.768 kHz clock generator. The clock generator counts 0 to 32,767 pulses to generate a 1 Hz clock signal that includes 32,768 pulses. However, when a frequency variation is introduced in the 32.768 kHz clock signal, the number of pulses either increases or decreases from the expected value of 32,768. For example, if the clock generator counts 32,769.146 pulses, a delay of 1.146 pulses (i.e., 32,769.146-32,768 pulses) is introduced. For the 1.146 pulse delay, '1 pulse' forms the coarse delay component and '0.146 pulse' forms the fine delay component. However, there presently is no solution to compensate for the fine frequency variations in each unit output cycle of the clock generator. Conventional delay compensation solutions require the predetermined interval to be more than one second to allow the fine part to be factored into the coarse compensation. For example, a 0.146 pulse delay would lead to a coarse value of −39 and a predetermined interval of 34 seconds. Thus, for every 34 seconds, there is a one second period that is shorter by 39 ticks of the 32.769.146 Hz clock signal.

It would therefore be advantageous to have a system that compensates for clock delay every unit output cycle of the clock generator, that switchably provides coarse and fine delay compensation, has low power consumption, and overcomes the above-mentioned shortcomings of the existing clock delay compensation systems.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
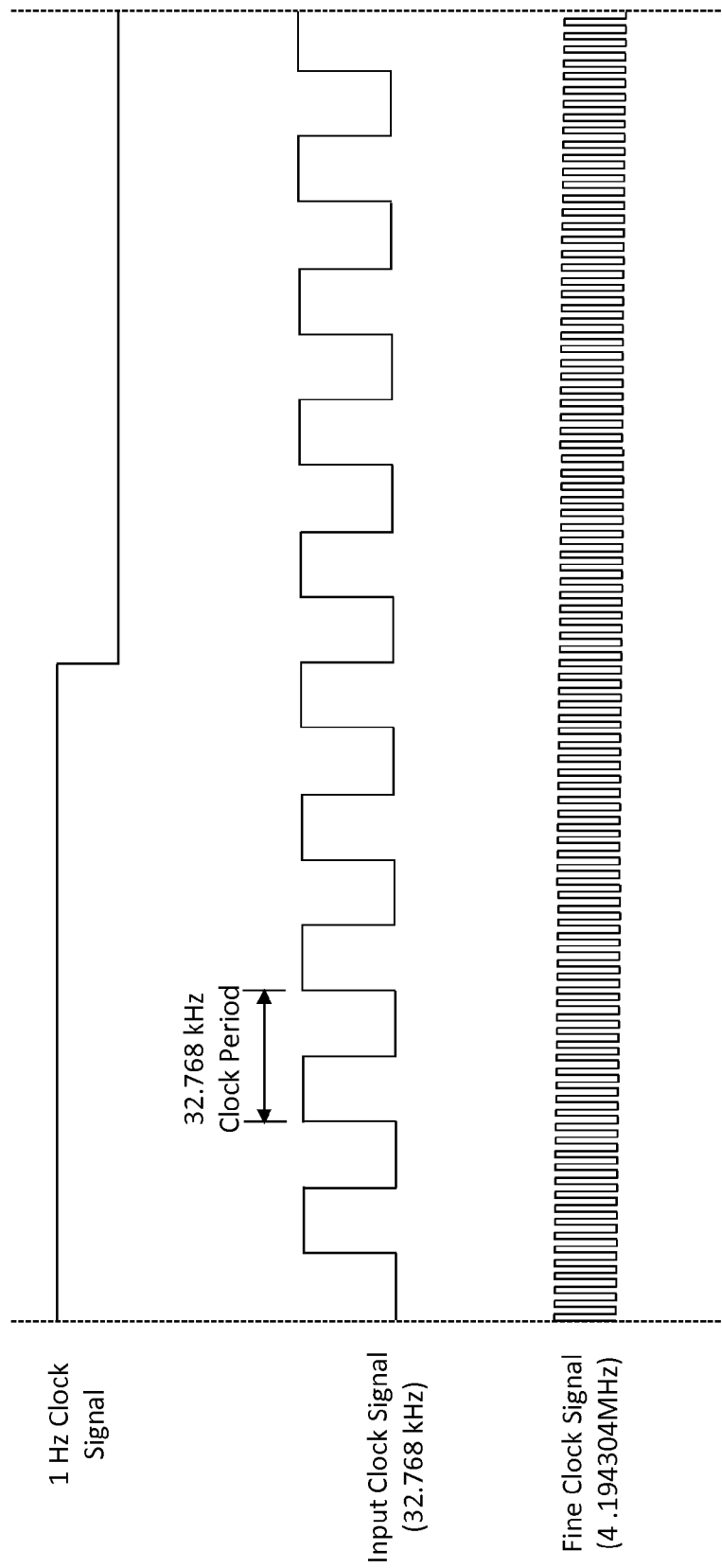
FIG. 1 is a timing diagram illustrating one hertz (Hz) input and fine clock signals in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. In the description, the terms multiplexer and demultiplexer have been abbreviated as mux and demux, respectively.

In an embodiment of the present invention, a system for compensating for variations in the frequency of an input clock signal having a first frequency is provided. A coarse counter receives the input clock signal, counts a predetermined number of clock pulses of the input clock signal, and generates a coarse compensated clock signal having a second frequency. A first compensation module is connected to the coarse counter and adjusts at least one clock pulse of the input clock signal based on a coarse compensation value. A residual period adjustment module is connected to the first compensation module, and accumulates a fine compensation value for each clock pulse of the coarse compensated clock signal. A fine counter is connected to the coarse counter and the residual period adjustment module and operates at a third frequency of a fine clock signal. The fine counter receives the accumulated fine compensation value, counts a number of fine clock pulses in each clock pulse of the coarse compensated clock signal, and generates a fine compensated clock signal having the second frequency based on the accumulated fine compensation value.

In another embodiment of the present invention, a system for compensating for variations in the frequency of an input clock signal having a first frequency is provided. A coarse counter receives the input clock signal, counts a predetermined number of clock pulses of the input clock signal, and generates a coarse compensated clock signal having a second frequency. A fine counter is connected to the coarse counter and operates on a third frequency of a fine clock signal. The fine counter counts a number of fine clock pulses in each clock pulse of the coarse compensated clock signal. A first compensation module is connected to the coarse counter, and adjusts at least one clock pulse in the coarse compensated clock signal based on a coarse compensation value. A pulse counter receives the input and fine clock signals and generates a reference count corresponding to a number of fine clock pulses in each clock pulse of the input clock signal. A residual period adjustment module is connected to the first compensation module and accumulates a fine compensation value for each clock pulse of the coarse compensated clock signal. A second compensation module is connected to the pulse counter and the residual period adjustment module, receives the accumulated fine compensation value, and determines an adjusted delay value based on the reference count. The second compensation module adjusts a clock edge of the coarse compensated clock signal based on the reference count and the adjusted delay value. The fine counter further generates a fine compensated clock signal having the second frequency when the number of fine clock pulses at least equals the adjusted delay value.

Various embodiments of the present invention provide a system for compensating for variations or delays in a clock signal. The system includes a coarse counter and a first compensation module for providing the coarse compensation and a fine counter and second compensation module for providing the fine compensation. The system further includes a pulse counter that counts the actual number of fine clock pulses required for adjusting the delay value in one clock pulse of the coarse compensated clock signal, thereby providing accurate compensation for frequency variations. Further, the system is flexible and capable of switching between coarse and fine compensation, i.e., the system selectively enables fine compensation whenever required which reduces power consumption and lowers operating costs of the system.

FIG. 1 shows timing diagrams of 1 hertz (Hz), input and fine clock signals. The input clock signal is a 32.768 kHz clock signal that has 32,768 clock pulses corresponding to one clock pulse of the 1 Hz clock signal. The input clock signal is used to provide coarse compensation to the 1 Hz clock signal. Similarly, the fine clock signal is a 4.194304 MHz clock signal that has 128 clock pulses corresponding to one pulse of the 32.768 kHz clock signal, and is used to provide fine compensation to the 1 Hz clock signal. References will be made to the timing diagrams of the signals depicted in FIG. 1, during the description of FIGS. 2 and 3.

Figure 2:
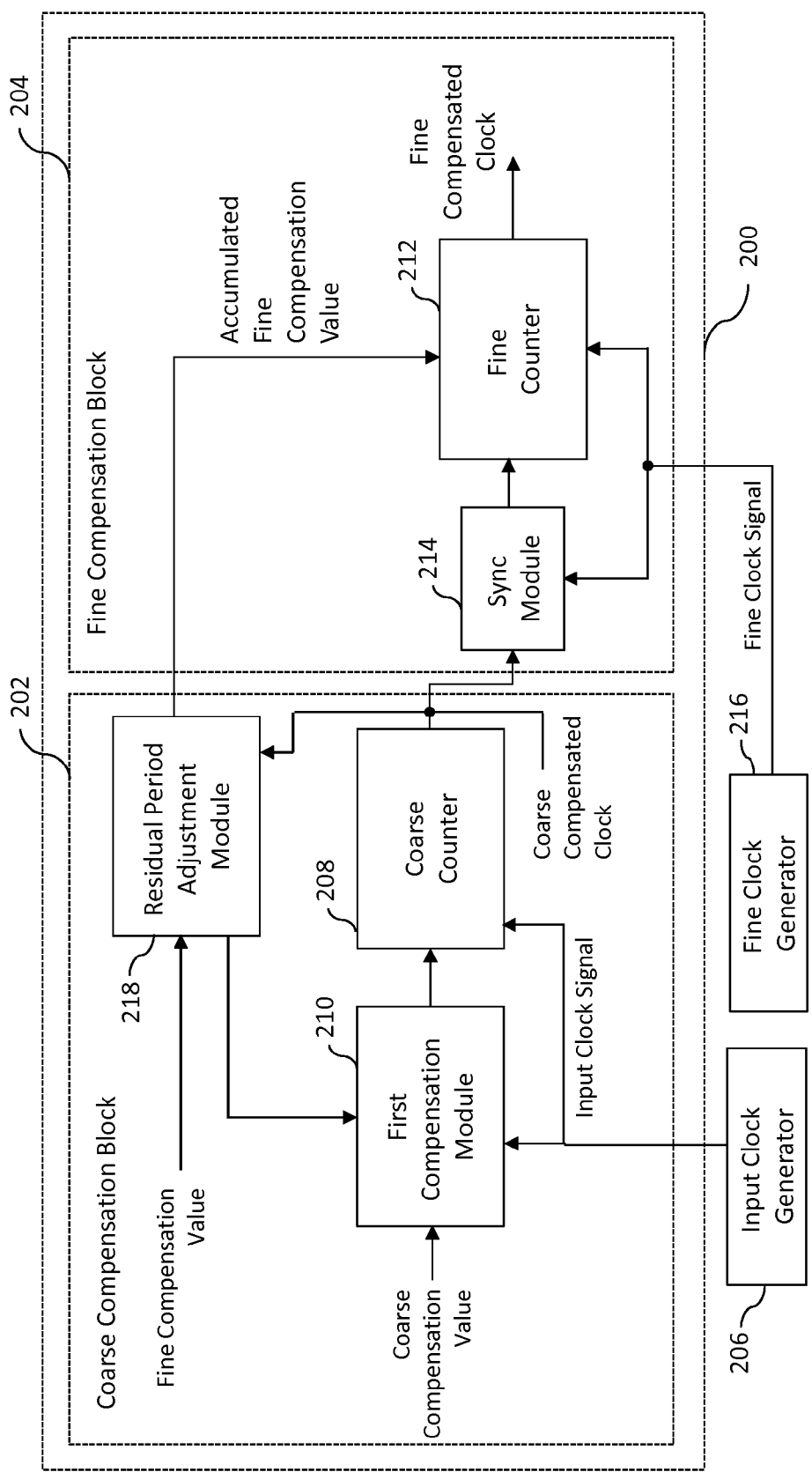
FIG. 2 is a schematic block diagram illustrating a system for compensating for variations in the frequency of an input clock signal in accordance with an embodiment of the present invention.

Referring now to FIG. 2, a schematic block diagram illustrating a system 200 for compensating for variations in the frequency of an input clock signal, in accordance with an embodiment of the present invention, is shown. The system 200 includes coarse and fine compensation blocks 202 and 204. The coarse compensation block 202 includes a coarse counter 208, a first compensation module 210, and a residual period adjustment module 218. The fine compensation block 204 includes a fine counter 212, and a clock synchronization module 214. An input clock generator 206 and a fine clock generator 216 provide input and fine clock signals to the system 200, respectively.

The input clock generator 206 is connected to the coarse counter 208 and the first compensation module 210. An external calibration apparatus (not shown) is connected to the first compensation module 210 and the residual period adjustment module 218, and provides coarse and fine compensation values thereto. The first compensation module 210 is connected to the coarse counter 208 and the synchronization module 214 is connected between the coarse and fine counters 208 and 212. The fine clock generator 216 is connected to the clock synchronization module 214 and the fine counter 212 and the residual period adjustment module 218 is connected to the first compensation module 210, the coarse counter 208, and the fine counter 212.

The input clock generator 206 generates an input clock signal having a first frequency. In an exemplary embodiment of the present invention, the input clock generator 206 generates a 32.768 kHz clock signal (shown in FIG. 1) that is provided as an input to the coarse counter 208 and the first compensation module 210. The coarse counter 208 counts a predetermined number of clock pulses using the 32.768 kHz clock signal. For example, the coarse counter 208 counts from 0 to 32,767 i.e., 32,768 pulses for each clock cycle of the input clock signal, to generate the coarse 1 Hz clock signal.

However, the count of the clock pulses may deviate from the expected value, due to variations in the frequency of the input clock signal. For example, the coarse counter 208 may not count correctly if the frequency of the input clock signal becomes 32769.146 kHz. The 1.146 pulse delay has a coarse delay component of one pulse (integer part), and a fine delay component of 0.146 pulses (fractional part). The external calibration apparatus determines the variation in the frequency of the input clock signal and generates a coarse compensation value that is equal to the coarse delay component. The coarse compensation value is provided to the first compensation module 210. The external calibration apparatus further generates a fine compensation value that is equal to the fine delay component. The fine compensation value is provided to the residual period adjustment module 218.

The coarse compensation block 202 may include a programmable register (not shown) that stores the coarse and fine compensation values. The coarse compensation value is used to compensate for the coarse delay component by adjusting (adding or removing) at least one clock pulse of the input clock cycle in a coarse 1 Hz period, thereby ensuring an accurate 1 Hz period of the input clock signal. The coarse counter 208 generates a coarse compensated clock signal after reaching a count of 32,767. In other words, the first compensation module 210 adjusts the start value of the coarse counter 208 based on the coarse compensation value to enable the coarse compensation. For example, when the coarse delay component is one, the coarse compensation value is one. The coarse counter 208 thereafter starts counting from −1 instead of zero and compensates by including an additional input clock pulse in the existing count of 32,768 pulses. In an embodiment of the present invention, the first compensation module 210 determines the start value of the coarse counter 208 by calculating a 2's complement of the coarse compensation value, or an increment thereof. For example, for a coarse compensation value of 1, the start value of the coarse counter is −1.

The coarse compensated 1 Hz signal is provided to the fine counter 212 that operates on a fine clock having a third frequency. In an embodiment of the present invention, the third frequency is higher than the first and second frequencies. The clock synchronization module 214 synchronizes the different clock domains i.e., the edges of coarse 1 Hz signal are aligned to the fine clock signal. The fine counter 212 counts a number of fine clock pulses in each pulse of the coarse 1 Hz clock signal, based on a fine clock signal generated by the fine clock generator 216. In an exemplary embodiment of the present invention, the fine clock generator 216 generates a 4.194304 MHz fine clock signal (shown in FIG. 1).

The coarse compensation block 202 provides the fine compensation value to the residual period adjustment module 218, which is expressed as a count of 4.194304 MHz clock cycles. In an embodiment of the present invention, the residual period adjustment module 218 may include an adder circuit and a comparator circuit (not shown). The adder circuit accumulates the fine compensation value for each clock pulse of the coarse 1 Hz clock signal and the comparator circuit compares the accumulated fine compensation value with a predetermined reference count of fine clock pulses in one clock pulse of the input clock signal. For example, the predetermined reference count is 128 if the frequency of the fine clock signal is 4.194304 MHz and that of the input clock signal is 32.768 kHz, as 128 fine clock pulses of the 4.194304 MHz signal form one clock pulse of the 32.768 KHz clock signal). In this example, the fine delay component of 0.146 corresponds to a fine compensation value of 19 fine clock pulses (i.e., 128*0.146 fine clock pulses). When the accumulated fine compensation value equals or exceeds the predetermined reference count, the first compensation module 210 adds a count of 1 to the start value of the coarse counter 208, thereby adding one input clock pulse to the output coarse 1 Hz clock signal and compensates for the accumulated fine delay component in the input clock signal. In case the accumulated fine compensation value exceeds the predetermined count, a difference between the accumulated fine compensation value and the predetermined count is stored in the adder circuit for the next clock cycle. For example, when the fine compensation value of 19 is added to an accumulated value of 115, the new accumulated fine compensation value becomes 134, a coarse clock pulse is added to the output clock signal, and the difference of 6 (134-128) is stored in the adder circuit for the subsequent clock cycles.

In addition, when the value of the fine counter 212 equals the accumulated fine compensation value, a fine 1 Hz clock pulse is generated at the output terminal of the fine counter 212. In an embodiment of the present invention, the coarse and fine compensation blocks 202 and 204 may be switchably operated by connecting a switch (not shown), such as a programmable control bit and placing a mux between the coarse and fine counters 208 and 212 so that clock output is always available. The system 200 can disable fine compensation block 204 when the fine compensated 1 Hz clock signal is not required and uses only the coarse compensation block 202, which reduces the power consumption and overall operating cost of the system 200, while still maintaining clock accuracy in the coarse compensated 1 Hz clock.

Figure 3:
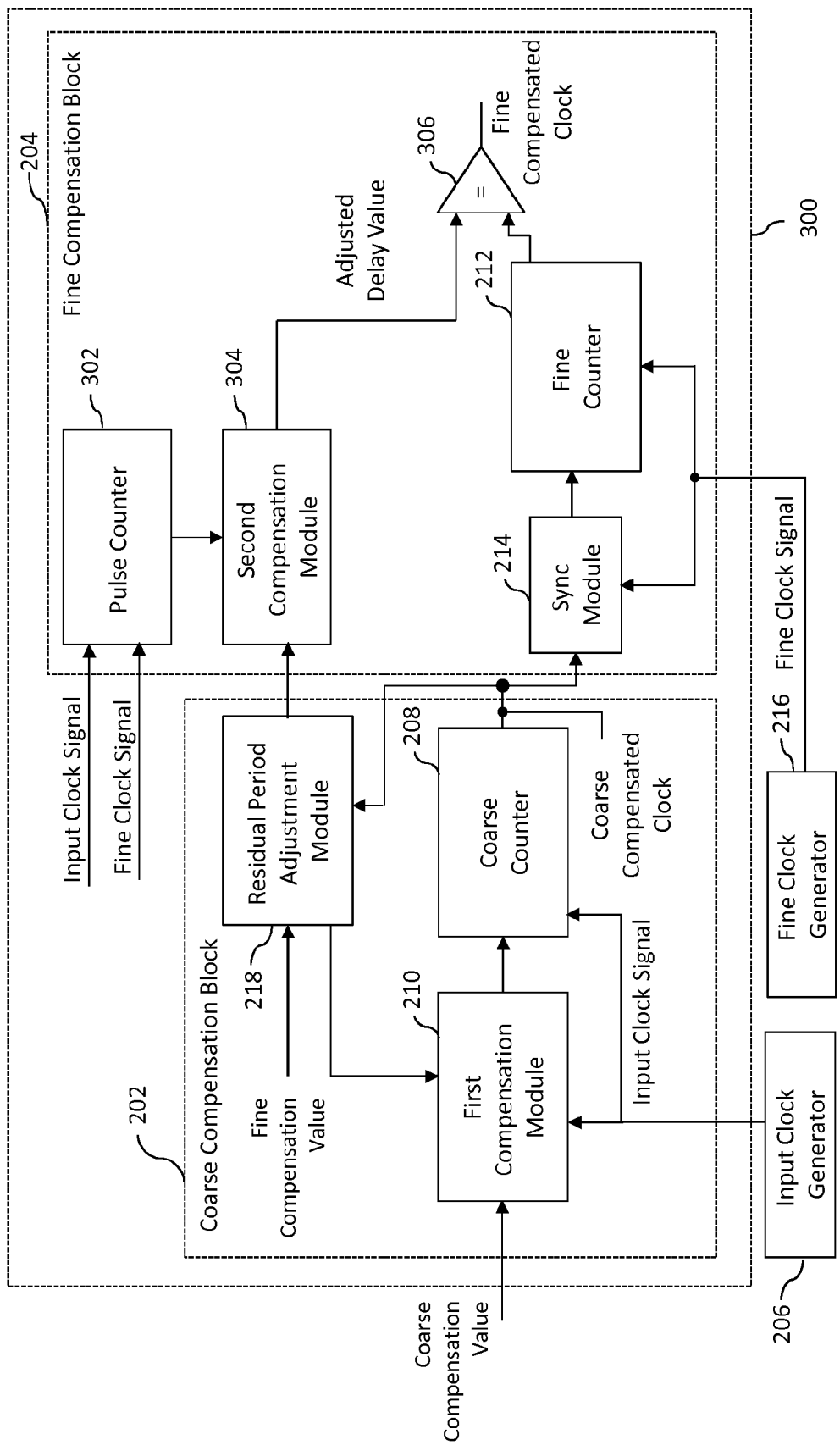
FIG. 3 is a detailed schematic block diagram illustrating a system for compensating for variations in the frequency of an input clock signal in accordance with another embodiment of the present invention.

Referring now to FIG. 3, a detailed schematic block diagram illustrating a system 300 for compensating for variations in the frequency of a clock signal, in accordance with an embodiment of the present invention, is shown. The system 300 is similar to the system 200 of FIG. 2, and includes coarse and fine compensation blocks 202 and 204. In addition, the fine compensation block 204 includes a pulse counter 302, a second compensation module 304 and a comparator circuit 306.

The pulse counter 302 is connected to the input and fine clock generators 206 and 216 for receiving the input and fine clock signals, respectively. The second compensation module 304 is connected to outputs of the pulse counter 302 and the residual period adjustment module 218. An output of the second compensation module 304 is connected to a first input terminal of the comparator circuit 306. A second input terminal of the comparator circuit 306 is connected to the output of the fine counter 212. The working of system 300 is similar to that of the system 200 of FIG. 2, and therefore, repetition is avoided so as not to obfuscate the present specification.

Fluctuating environmental conditions such as changes in the ambient temperature and voltage introduce variations in the frequency of the fine clock signal, which results in an increase or decrease in the count of fine clock pulses in one coarse pulse. As a result, the predetermined count, which is used as a reference for fine compensation, may lead to errors in the output clock signals. To compensate for the change in the number of fine clock pulses, the pulse counter 302 counts the actual number of fine clock pulses in every pulse of the input clock signal to generate a reference count. For example, if the frequency of the fine clock signal changes from 4.194304 MHz to 5.2429 MHz, the count of fine clock pulses for each input clock pulse changes to 160 (i.e., 128*(5.2429/4.194304)) instead of the expected 128 pulses. The pulse counter 302 counts 160 fine clock pulses (reference count) and provides the reference count to the second compensation module 304.

Based on the reference count, the second compensation module 304 determines an adjusted delay value, which is theoretically given by the equation (1) below:

$$\text{Adjusted delay value} = \text{accumulated fine compensation value} * [\text{reference count}/\text{predetermined count}] \quad (1)$$

For example, if the accumulated fine compensation value is 57, and the frequency of the fine clock changes from 4.194304 MHz to 5.2429 MHz, the adjusted delay value is computed as:

$$\text{Adjusted delay value} = 57*(160/128) = 71 \text{ (rounded to lower integer)}.$$

The adjusted delay value compensates for any change of frequency of the fine clock signal.

The second compensation module 304 provides the adjusted delay value to the comparator circuit 306. The comparator circuit 306 compares the adjusted delay value with the count of the fine clock pulses provided by the fine counter 212. When the adjusted delay value matches with the count, the output of the comparator circuit 306 generates a fine compensated 1 Hz clock pulse and provides fine adjustment to the coarse compensated clock signal and compensates for the change of frequency of the input clock signal.

In an embodiment of the present invention, the coarse and fine compensation blocks 202 and 204 may be switchably operated by connecting a switch (not shown) controlled by a programmable control bit or a mux between the coarse and fine counters 208 and 212 so that clock output is always available. The system 200 can disable the fine compensation block 204 when the fine compensated 1 Hz clock signal is not required and use only the coarse compensation block 202, which reduces the power consumption and overall operating cost of the system 200, while maintaining clock accuracy in the coarse compensated 1 Hz signal. When the fine compensation block 204 is powered off, the coarse clock compensation block 202 is selected automatically and operates independently as the coarse compensation block 202 is always powered on. The fine clock generator 216 can be kept disabled, and is enabled only when the fine counter 212 is required to operate, to reduce the overall power consumption of the system, as the power consumed by the fine clock generator 216 is saved. The coarse 1 Hz clock signal accurately adjusts one clock period while the fine 1 Hz clock signal accurately adjusts one clock period as well as manages the clock edge placement.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for compensating for variations in the frequency of an input clock signal having a first frequency, comprising:
   a coarse counter that receives the input clock signal, counts a predetermined number of clock pulses of the input clock signal, and generates a coarse compensated clock signal having a second frequency;
   a first compensation module, connected to the coarse counter, that adjusts at least one clock pulse of the input clock signal based on a coarse compensation value;
   a residual period adjustment module, connected to the first compensation module, that accumulates a fine compensation value for each clock pulse of the coarse compensated clock signal; and
   a fine counter, connected to the coarse counter and the residual period adjustment module and operating at a third frequency of a fine clock signal, that receives the accumulated fine compensation value, counts a number of fine clock pulses in each clock pulse of the coarse compensated clock signal, and generates a fine compensated clock signal having the second frequency based on the accumulated fine compensation value.

2. The system of claim 1, wherein the first compensation module further adjusts a clock pulse of the input clock signal when the accumulated fine compensation value at least equals a predetermined count.

3. The system of claim 1, further comprising a clock synchronization circuit connected between the coarse counter and the fine counter, for synchronizing the first and third frequencies.

4. The system of claim 1, wherein the first compensation module adjusts the at least one clock pulse by adjusting a start value of the coarse counter.

5. The system of claim 4, wherein the first compensation module includes at least one programmable register for storing the coarse and fine compensation values, wherein the coarse and fine compensation values are determined by an external calibration apparatus.

6. The system of claim 5, wherein the first compensation module determines the start value of the coarse counter using a two's complement of the coarse compensation value.

7. The system of claim 1, wherein the residual period adjustment module includes an accumulator circuit for accumulating the fine compensation value.

8. The system of claim 1, further comprising a pulse counter that receives the input and fine clock signals, generates a reference count corresponding to a number of fine clock pulses in each clock pulse of the input clock signal.

9. The system of claim 8, further comprising a second compensation module connected to the pulse counter and the residual period adjustment module, which receives the accumulated fine compensation value, and determines an adjusted delay value based on the reference count, wherein the second compensation module further adjusts a clock edge of the coarse compensated clock signal based on reference count and the adjusted delay value.

10. The system of claim 9, further comprising a comparator connected between the fine counter and the second compensation module, for comparing the adjusted delay value with the number of fine clock pulses, wherein the comparator generates the fine compensated clock signal based on the comparison.

11. The system of claim 10, further comprising a switch connected between the coarse and fine counters for enabling selective use of at least one of the coarse counter and a combination of the coarse and fine counters.

12. A system for compensating for variations in the frequency of an input clock signal having a first frequency, comprising:
   a coarse counter that receives the input clock signal, counts a predetermined number of clock pulses of the input clock signal, and generates a coarse compensated clock signal having a second frequency;
   a fine counter, connected to the coarse counter and operating on a third frequency of a fine clock signal, that counts a number of fine clock pulses in each clock pulse of the coarse compensated clock signal;
   a first compensation module, connected to the coarse counter, that adjusts at least one clock pulse in the input clock signal based on a coarse compensation value;
   a pulse counter that receives the input and fine clock signals and generates a reference count corresponding to a number of fine clock pulses in each clock pulse of the input clock signal;
   a residual period adjustment module, connected to the first compensation module, that accumulates a fine compensation value for each clock pulse of the coarse compensated clock signal; and
   a second compensation module, connected to the pulse counter and the residual period adjustment module, that receives the accumulated fine compensation value and determines an adjusted delay value based on the reference count, wherein the fine counter further generates a fine compensated clock signal having the second frequency when the number of fine clock pulses counted by fine counter at least equals the adjusted delay value, and wherein the first compensation module further adjusts a clock pulse of the input clock signal when the accumulated fine compensation value at least equals the predetermined reference count.

13. The system of claim 12, further comprising a clock synchronization circuit connected between the coarse and fine counters, for synchronizing the first and third frequencies.

14. The system of claim 12, wherein the first compensation module adjusts the at least one clock pulse by adjusting a start value of the coarse counter.

15. The system of claim 12, wherein the first compensation module includes at least one programmable register for storing the coarse and fine compensation values, wherein the coarse and fine compensation values are determined by an external calibration apparatus.

16. The system of claim 15, wherein the first compensation module determines the start value of the coarse counter using a two's complement of the coarse compensation value.

17. The system of claim 12, wherein the residual period adjustment module includes an accumulator circuit for accumulating the fine compensation value.

18. The system of claim 12, further comprising a comparator connected between the fine counter and the second compensation module, for comparing the adjusted delay value with the number of fine clock pulses, wherein the comparator generates the fine compensated clock signal based on the comparison.

19. The system of claim 18, further comprising a switch connected between the coarse and fine counters for enabling selective use of at least one of the coarse counter and a combination of the coarse and fine counters.

* * * * *